United States Patent
Geisen et al.

(10) Patent No.: US 12,020,098 B2
(45) Date of Patent: Jun. 25, 2024

(54) METHOD FOR PRODUCING A COMPONENT PROVIDED WITH A CODE, AND COMPONENT HAVING A CODE

(71) Applicant: Siemens Energy Global GmbH & Co. KG, Munich (DE)

(72) Inventors: Ole Geisen, Berlin (DE); Thomas Lenzen, Aachen (DE)

(73) Assignee: Siemens Energy Global GmbH & Co. KG, Munich (DE)

( * ) Notice: Subject to any disclaimer, the term of this patent is extended or adjusted under 35 U.S.C. 154(b) by 0 days.

(21) Appl. No.: 16/961,729

(22) PCT Filed: Feb. 6, 2019

(86) PCT No.: PCT/EP2019/052843
§ 371 (c)(1),
(2) Date: Jul. 13, 2020

(87) PCT Pub. No.: WO2019/179689
PCT Pub. Date: Sep. 26, 2019

(65) Prior Publication Data
US 2021/0064948 A1     Mar. 4, 2021

(30) Foreign Application Priority Data

Mar. 20, 2018    (DE) .................... 10 2018 204 259.4

(51) Int. Cl.
*G06K 19/06*     (2006.01)
*G06F 30/20*     (2020.01)

(52) U.S. Cl.
CPC ....... *G06K 19/06159* (2013.01); *G06F 30/20* (2020.01); *G06K 19/06037* (2013.01)

(58) Field of Classification Search
CPC .......... G06K 7/10366; G06K 7/10346; G06K 19/0723; G06K 19/07786; G06K 19/06159; G06K 19/06037; G06F 30/20
See application file for complete search history.

(56) References Cited

U.S. PATENT DOCUMENTS

| | | | | |
|---|---|---|---|---|
| 10,762,407 B2 * | 9/2020 | Gold | ...................... | B33Y 80/00 |
| 10,906,247 B2 * | 2/2021 | Flores | .................... | G06K 1/121 |

(Continued)

FOREIGN PATENT DOCUMENTS

| | | |
|---|---|---|
| CN | 105760912 A | 7/2016 |
| DE | 102009015327 A1 | 9/2010 |

(Continued)

OTHER PUBLICATIONS

PCT International Search Report and Written Opinion of International Searching Authority dated May 27, 2019 corresponding to PCT International Application No. PCT/EP2019/052843 filed Feb. 6, 2019.

*Primary Examiner* — Sonji N Johnson

(57) ABSTRACT

A method in which a three-dimensional component is produced and is provided on its component surface with a machine-readable code, wherein the code is produced in one part with the component and has a plurality of three-dimensional code elements, which represent the coded data in binary form on the basis of raised regions and non-raised regions in relation to a reference plane. A method in which a three-dimensional component is produced and is provided on its component surface with a machine-readable code, wherein the code is produced in one part with the component and has a plurality of three-dimensional code elements which represent the coded data in binary form on the basis of recessed regions and non-recessed regions in relation to a reference plane. A component includes such a code.

10 Claims, 3 Drawing Sheets

(56) References Cited

U.S. PATENT DOCUMENTS

| | | | |
|---|---|---|---|
| 11,042,869 B1* | 6/2021 | Jezorek | G06Q 20/12 |
| 2005/0040231 A1* | 2/2005 | Allison | G06K 7/10881 |
| | | | 235/385 |
| 2012/0187187 A1* | 7/2012 | Duff | G06Q 10/00 |
| | | | 235/382 |
| 2012/0203365 A1* | 8/2012 | Hummeler | B28B 1/001 |
| | | | 700/98 |
| 2013/0341400 A1 | 12/2013 | Lancaster-Larocque | |
| 2015/0145158 A1 | 5/2015 | Levine et al. | |
| 2015/0287247 A1* | 10/2015 | Willis | G06K 19/07758 |
| | | | 345/419 |
| 2016/0025657 A1* | 1/2016 | Shahbazmohamadi | G10D 9/02 |
| | | | 378/20 |
| 2016/0052058 A1 | 2/2016 | Bonke et al. | |
| 2016/0142713 A1 | 5/2016 | Ahrweiler et al. | |
| 2019/0054731 A1* | 2/2019 | Christian | B33Y 50/00 |
| 2019/0102815 A1* | 4/2019 | Norman | G06Q 30/06 |
| 2019/0283130 A1* | 9/2019 | Dinter | B33Y 50/02 |
| 2021/0170690 A1* | 6/2021 | Gupta | G06K 19/06159 |

FOREIGN PATENT DOCUMENTS

| | | | |
|---|---|---|---|
| DE | 102009043317 A1 | 3/2011 | |
| DE | 102012018388 A1 | 3/2014 | |
| DE | 102014104196 A1 | 10/2014 | |
| DE | 202017105458 U1 | 10/2017 | |
| DE | 102016210990 A | 12/2017 | |
| JP | 5731059 B1 | 6/2015 | |
| WO | 0209018 A2 | 1/2002 | |
| WO | 03058544 A1 | 7/2003 | |

* cited by examiner

METHOD FOR PRODUCING A COMPONENT PROVIDED WITH A CODE, AND COMPONENT HAVING A CODE

CROSS REFERENCE TO RELATED APPLICATIONS

This application is the US National Stage of International Application No. PCT/EP2019/052843 filed 6 Feb. 2019, and claims the benefit thereof. The International Application claims the benefit of German Application No. DE 10 2018 204 259.4 filed 20 Mar. 2018. All of the applications are incorporated by reference herein in their entirety.

FIELD OF INVENTION

The present invention relates to a method in which a three-dimensional component is produced and is provided with a machine-readable code on its component surface. Furthermore, the present invention relates to a component comprising such a code.

BACKGROUND OF INVENTION

The prior art discloses providing components with a code after their production, which is used as an identifier for the component. In addition to the component identification, such a code may also be used to store additional information about the component, in particular information about the production requirements of the component, in order thereby to enable component tracking which is as accurate as possible.

The most widely distributed example of such a code is the so-called serial number, which is an unambiguous alphanumeric identifier. Such a serial number is usually designed three-dimensionally and is permanently applied, for example, in the form of an engraving. One disadvantage of such a serial number is that the component is provided with such a serial number only after its production, thus requiring an additional operation. In addition, a component can be inadvertently labeled with an incorrect serial number. In addition, the machine readout of serial numbers can be achieved only by using complicated technical methods, which is undesirable.

Alternatively to the serial number, two-dimensionally designed codes are used for identifying components, in particular bar codes, which depict the encoded data in a binary format in the form of black bars on a white background, and QR codes, which are formed from a square matrix made up of black and white squares which depict the encoded data in a binary format. A significant advantage of bar codes and QR codes is that they are machine-readable. The QR code is in particular enjoying increasing popularity, since, on the one hand, it allows a large amount of information to be depicted in a small area. On the other hand, said QR code can be read out using widely available technical devices, for example, using a smartphone which is provided with corresponding readout software. However, one serious disadvantage of bar codes and QR codes is that they must be applied to the component surface in a separate method step. In particular, assignment errors may thereby occur. Depending on the type of code and its application to the component surface, a subsequent detachment or unlawful replacement of the code also cannot be ruled out.

SUMMARY OF INVENTION

Based on this prior art, one object of the present invention is to provide an alternative method of the kind initially specified.

To achieve this object, the present invention provides a method of the kind initially specified, which is characterized in that the code is produced as one piece with the component, and comprises a plurality of three-dimensionally designed code elements which depict the encoded data in a binary format, using raised areas and non-raised areas with reference to a reference plane.

Alternatively or additionally, according to the present invention, the aforementioned object is achieved via a method of the type mentioned at the outset, which is characterized in that the code is produced as one piece with the component, and comprises a plurality of three-dimensionally designed code elements which depict the encoded data in a binary format, using recessed areas and non-recessed areas with reference to a reference plane.

The one-piece configuration of the code and component is advantageous in that the code is permanently connected to the component and correspondingly cannot be easily removed or replaced. In addition, the component and the code are generally produced in one operation on the same production machine, such that an erroneous assignment can be ruled out.

Advantageously, the code elements are arranged in a matrix defining rows and columns, in particular analogously to a QR code. Correspondingly, the code according to the present invention can be read out similarly to or exactly like a conventional QR code.

Preferably, the code elements comprise either a number of raised areas or recessed areas which are arranged in a regular matrix and which correspond to an integer number of squares, or they are made up of a single non-raised area or non-recessed area. Thus, in the simplest case, a code element may be formed by a single raised or recessed area or by a single non-raised or non-recessed area. However, it is also alternatively possible that a code element is formed by means of several raised or recessed areas which are in particular arranged in a square arrangement. This may potentially improve the readability of the code or decrease the susceptibility to errors.

According to one embodiment of the present invention, the component and the code are produced from the same starting material, whereby in particular the production is simplified.

To increase the contrast between the raised areas or the recessed areas and the non-raised or non-recessed areas, the raised or recessed areas are advantageously formed in a pyramidal, frustopyramidal, conical, frustoconical, or spherical segment-shaped shape, wherein pyramidal is presently to be understood to mean any uniformly formed body having at least three tapered side faces. Raised or recessed areas formed in such a way reflect incident light differently than the non-raised or non-recessed areas, whereby the contrast between the differently formed code elements, and thus the readability of the code, is significantly improved.

According to one embodiment of the present invention, the component and the code are produced layer by layer on an additive production machine, on the basis of a 3D-CAD data set, wherein the 3D-CAD data set comprises data defining the geometry of the component, data relating to the position of the code on the component surface, and data relating to the geometry of the code, or is made up of these data. The additive production machine may generally be a production machine on which a component can be produced from a starting material. Thus, the additive production machine may, for example, be designed to carry out a photopolymerization method, an SLM (selective laser melting) method, an SLS (selective laser sintering) method, or the like.

Alternatively, the component and the code may be produced layer by layer on an additive production machine, on the basis of a 3D-CAD data set, wherein the 3D-CAD data set comprises data defining the geometry of the component and data relating to the position of the code on the component surface, or is made up of these data, and wherein data relating to the geometry of the code are added to the 3D-CAD data set before the additive production by means of CAM software. Thus, the 3D-CAD data set always remains unchanged, independently of the code.

If the component is produced in series, advantageously, only data relating to the geometry of the code is changed after the production of each component. In other words, in the case of series components, data defining the geometry of the component and data relating to the position of the code on the component surface are respectively adopted for all components of the series, while only those data which relate to the geometry of the code are replaced. In this way, the generation of the code in the series production is simplified, whereby in particular computing power can be saved.

Furthermore, the present invention provides a component which is provided with a machine-readable code on its component surface, for example by means of the described method or methods, wherein the code is formed as one piece with the component, and comprises a plurality of three-dimensionally designed code elements which depict the encoded data in a binary format, using raised areas and non-raised areas with reference to a reference plane.

In addition, the present invention provides a component which is provided with a machine-readable code on its component surface, for example by means of the described method or methods, wherein the code is formed as one piece with the component, and comprises a plurality of three-dimensionally designed code elements which depict the encoded data in a binary format, using recessed areas and non-recessed areas with reference to a reference plane.

The code elements are advantageously arranged in a matrix defining rows and columns, in particular analogously to a QR code.

Advantageously, the code elements comprise either a number of raised areas or recessed areas which are arranged in a regular matrix and which correspond to an integer number of squares, or are made up of a single non-raised area or non-recessed area.

According to an embodiment according to the present invention, the component and the code are produced from the same starting material.

Preferably, the raised areas and the recessed areas are formed in a pyramidal, frustopyramidal, conical, frustoconical, or spherical segment-shape.

BRIEF DESCRIPTION OF THE DRAWINGS

Additional features and advantages of the present invention will become clear with the aid of the following description of methods according to the present invention, using the accompanying drawing. The following are depicted.

DETAILED DESCRIPTION OF INVENTION

Figure 1:
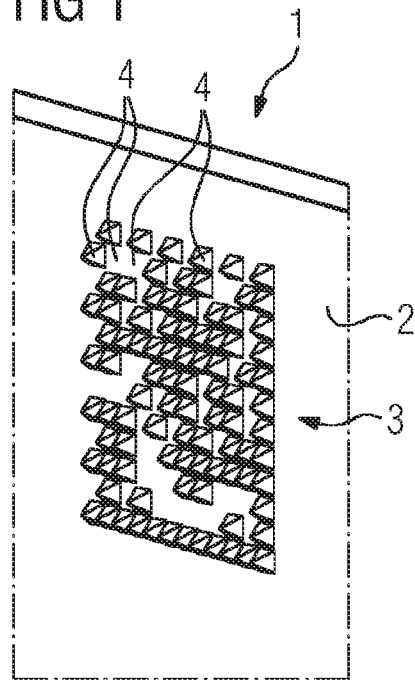
FIG. 1 depicts a perspective partial view of a component, of which the component surface is provided with a code according to a first embodiment of the present invention.

Below, identical reference numerals denote identical or similarly formed components.

FIG. 1 depicts a component 1, on the component surface 2 of which a code 3 according to a first embodiment of the present invention is arranged in a functionally non-relevant area, which contains information acting as an identifier of the component 1, and additional information which in particular relates to the production requirements of the component, in order thereby to enable component tracking which is as exact as possible. The code 3 is produced as one piece with, and from, the same starting material as the component 1, and comprises a plurality of three-dimensionally designed code elements 4 which are arranged in the manner of a QR code in a N×M matrix, wherein N corresponds to the number of rows, and M corresponds to the number of columns. Presently, N=12 and M=12 are chosen, such that collectively, a square matrix results. The code elements 4 depict the encoded data in a binary format, using raised areas and non-raised areas with reference to a reference plane defined by the component surface 2, wherein the raised areas respectively have the form of a pyramid having four tapering side walls. Each code element 4 is formed either by a single raised area or by a single non-raised area within the reference plane. Owing to the pyramidal shape of the raised areas, the light reflection behavior of the raised areas is to be clearly distinguished from that of the non-raised areas, whereby the machine readability of the code 3 is fostered. For performing a readout, for example, a smartphone having an integrated camera and corresponding software, or a comparable readout system, may be used, as for reading out a QR code.

Figure 2:
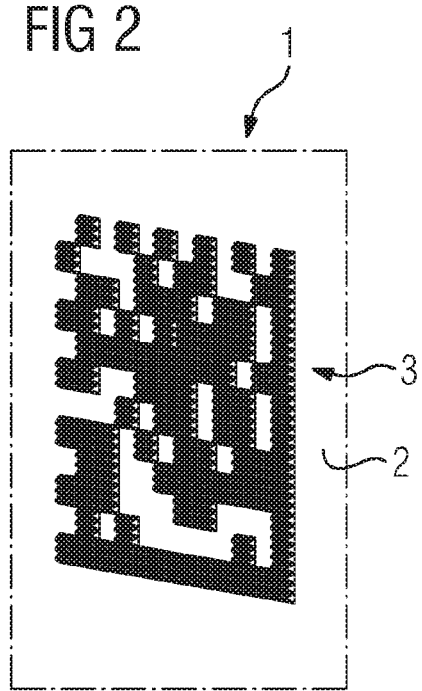
FIG. 2 depicts a perspective partial view of a component of which the component surface is provided with a code according to a second embodiment of the present invention.

FIG. 2 depicts a component 1, on the component surface 2 of which a code 3 according to a second embodiment of the present invention is arranged in a functionally non-relevant area. Said code differs from the code depicted in FIG. 1 only in that each code element is formed either by means of nine raised areas arranged in a square submatrix, or by means of a single non-raised area within the reference plane, the area of which corresponds to the area of nine raised areas in a square arrangement. This is advantageous in that the contrast between the code elements 4 made up of raised areas and the code elements 4 respectively made up of a non-raised area becomes clearer, thus favoring the machine readability of the code 3. At this point, it should be mentioned that, instead of nine raised areas per code element 4, a different number of raised areas arranged in a regular matrix may also generally be used per code element 4, which corresponds to an integer square number, i.e., 4, 16, 25, . . . raised areas.

Figure 3:
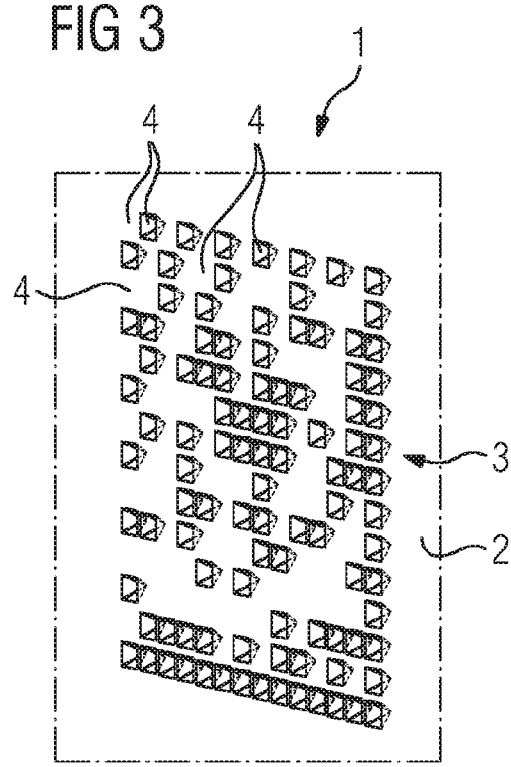
FIG. 3 depicts a perspective partial view of a component of which the component surface is provided with a code according to a third embodiment of the present invention.

FIG. 3 depicts a component 1, on the component surface 2 of which a code 3 according to a third embodiment of the present invention is arranged in a functionally non-relevant area. Said code differs from the code 3 depicted in FIG. 1 only in that, instead of pyramidal raised areas, such areas are provided which are pyramidally recessed with respect to the reference plane defined by the component surface 2. Likewise, an arrangement analogous to FIG. 2 is conceivable, having recessed areas instead of raised areas.

Figure 4:
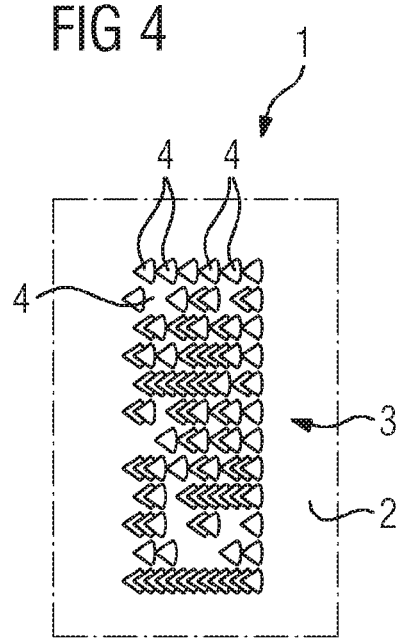
FIG. 4 depicts a perspective partial view of a component of which the component surface is provided with a code according to a fourth embodiment of the present invention.

FIG. 4 depicts a component 1, on the component surface 2 of which a code 3 according to a fourth embodiment of the present invention is arranged in a functionally non-relevant area. Said code differs from the code 3 depicted in FIG. 1 only in that conical raised areas are provided instead of pyramidal raised areas. Even if this is presently not depicted, each code element 4 may comprise a number of raised areas which are arranged in a square submatrix, analogously to FIG. 2, and which correspond to an integer square number, i.e., 4, 9, 16, 25 . . . raised areas. Likewise, the raised areas may be replaced by recessed areas, analogously to FIG. 3.

Figure 5:
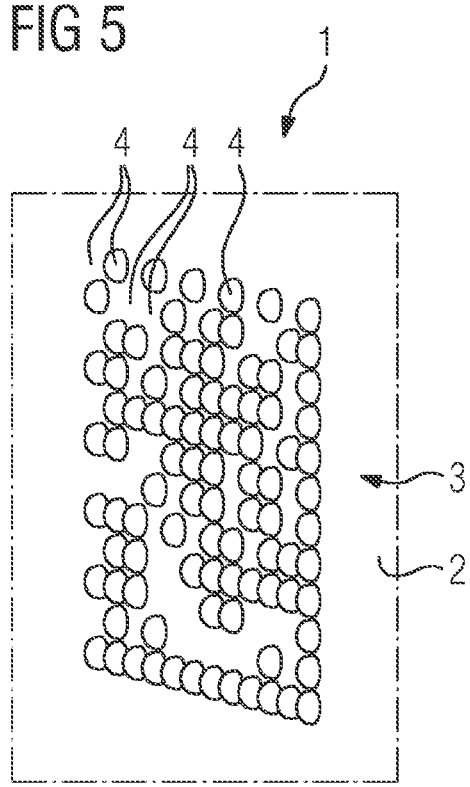
FIG. 5 depicts a perspective partial view of a component of which the component surface is provided with a code according to a fifth embodiment of the present invention.

FIG. 5 depicts a component 1, on the component surface 2 of which a code 3 according to a fifth embodiment of the present invention is arranged in a functionally non-relevant area. Said code differs from the code 3 depicted in FIG. 1 only in that spherical segment-shaped raised areas are provided instead of pyramidal raised areas. Even if this is presently not depicted, each code element 4 may comprise a number of raised areas which are arranged in a square submatrix, analogously to FIG. 2, and which correspond to an integer square number, i.e., 4, 9, 16, 25 . . . raised areas. Likewise, the raised areas may be replaced by recessed areas, analogously to FIG. 3.

The components depicted in FIGS. 1 to 5 are characterized in that the codes 3 are respectively produced as one piece with said components, such that the codes 3 cannot be easily separated from the component 1 or manipulated. The three-dimensional codes 3 arranged in the manner of a QR code can contain a large amount of information and are machine-readable in a simple manner.

Figure 6:
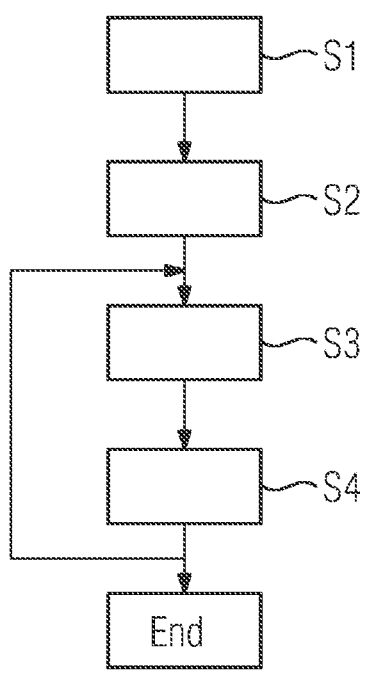
FIG. 6 depicts a schematic view of a method according to one embodiment of the present invention.

FIG. 6 schematically depicts a method according to an embodiment of the present invention, via which one of the components 1 depicted in FIGS. 1 to 5, including its code 3, can be produced in series.

In a step S1, using a computer, a 3D-CAD data set is created which images the component 1 including the code 3, and which can be processed on an additive production machine. The 3D-CAD data set comprises data defining the geometry of the component, data relating to the position of the code on the component surface, and data relating to the geometry of the code, or is made up of these data.

In a second step S2, the component 1 and the code 3 are produced layer by layer on an additive production machine, on the basis of the 3D-CAD data set created in step S1.

In a step S3, a new 3D-CAD data set is created for the next of the components 1 to be produced in series, including the associated code 3. Here, the data defining the geometry of the component and the data of the 3D-CAD data set created in step S1 relating to the position of the code on the component surface are adopted, and only the data relating to the geometry of the code are replaced by new data.

In a step S4, the component 1 and the code 3 are then produced layer by layer on an additive production machine, on the basis of the 3D-CAD data set created in step S3.

Steps S3 and S4 are then repeated as a function of the number of components 1 to be produced in series.

The previously described method is characterized in that the component 1 and the associated code 3 can be produced in a single operation. A permanently correct assignment of the component 1 and the code 3 can thus always be ensured.

Alternatively, in step S1, using a computer, a 3D-CAD data set is created which images the component 1 and the position of the code 3 on the component 1, and which can be processed on an additive production machine. The 3D-CAD data set thus comprises data defining the geometry of the component and data relating to the position of the code on the component surface, or is made up of these data. Furthermore, in step S1, data relating to the geometry of the code 3 are added to this created 3D-CAD data set by means of CAM software.

In a second step S2, the component 1 and the code 3 are produced layer by layer on an additive production machine, on the basis of the data created in step 1.

In step S3, modified data relating to the geometry of the code 3 are added to the 3D-CAD data set from step 1 by means of CAM software.

In step S4, the component 1 and the code 3 are then produced layer by layer on an additive production machine on the basis of the data created in step S3.

Steps S3 and S4 are then repeated as a function of the number of components 1 to be produced in series.

Although the present invention has been illustrated and described in greater detail via the exemplary embodiment, the present invention is not limited by the disclosed examples, and other variations may be derived from it by those skilled in the art, without departing from the protective scope of the present invention.

The invention claimed is:

1. A method in which a three-dimensional component is produced and is provided with a machine-readable code on its component surface, the method comprising:
    producing the code and the component contemporaneously as one piece, wherein the code comprises a plurality of three-dimensionally designed code elements which depict the encoded data in a binary format, using raised areas and non-raised areas with reference to a reference plane,
    wherein the component and the code are produced layer by layer on an additive production machine, on the basis of a 3D-CAD data set, with the code elements positioned on the component surface and visibly readable at the component surface,
    wherein the 3D-CAD data set comprises data defining the geometry of the component and data relating to the position of the code on the component surface, or is made up of these data, and
    wherein data relating to the geometry of the code are added to the 3D-CAD data set before the additive production, by means of CAM software,
    wherein the raised areas are formed in a pyramidal, frustopyramidal, conical, frustoconical, or spherical segment-shape,
    wherein a plurality of three-dimensional components are produced in a series by repeating the method and only changing the data relating to the geometry of a serialized code base on the machine readable code.

2. The method as claimed in claim 1, wherein the code elements are arranged in a matrix defining rows and columns, in particular analogously to a QR code.

3. The method as claimed in claim 1, wherein the code elements comprise a number of raised areas which are arranged in a regular matrix and which correspond to an integer number of squares, or are made up of a single non-raised area.

4. The method as claimed in claim 1, wherein the component and the code are produced from the same starting material.

5. The method as claimed in claim 1, wherein the component is produced in series, wherein only data relating to the geometry of the code is changed after the production of each component.

6. A method in which a three-dimensional component is produced and is provided with a machine-readable code on its component surface, the method comprising:
producing the code and the component contemporaneously as one piece, wherein the code comprises a plurality of three-dimensionally designed code elements which depict the encoded data in a binary format, using recessed areas and non-recessed areas with reference to a reference plane,
wherein the component and the code are produced layer by layer on an additive production machine, on the basis of a 3D-CAD data set, with the code elements positioned on the component surface and visibly readable at the component surface,
wherein the 3D-CAD data set comprises data defining the geometry of the component and data relating to the position of the code on the component surface, or is made up of these data, and
wherein data relating to the geometry of the code are added to the 3D-CAD data set before the additive production, by means of CAM software,
wherein the recessed areas are formed in a pyramidal, frustopyramidal, conical, frustoconical, or spherical segment-shape,
wherein a plurality of three-dimensional components are produced in a series by repeating the method and only changing the data relating to the geometry of a serialized code base on the machine readable code.

7. The method as claimed in claim 6, wherein the code elements are arranged in a matrix defining rows and columns, in particular analogously to a QR code.

8. The method as claimed in claim 6, wherein the code elements comprise a number of recessed areas which are arranged in a regular matrix and which correspond to an integer number of squares, or are made up of a single non-recessed area.

9. The method as claimed in claim 6, wherein the component and the code are produced from the same starting material.

10. The method as claimed in claim 6, wherein the component is produced in series, wherein only data relating to the geometry of the code is changed after the production of each component.

* * * * *